United States Patent
Herr

(10) Patent No.: US 6,917,216 B2
(45) Date of Patent: Jul. 12, 2005

(54) SUPERCONDUCTOR OUTPUT AMPLIFIER

(75) Inventor: Quentin P. Herr, Torrance, CA (US)

(73) Assignee: Northrop Grumman Corporation, Los Angeles, CA (US)

(*) Notice: Subject to any disclaimer, the term of this patent is extended or adjusted under 35 U.S.C. 154(b) by 237 days.

(21) Appl. No.: 10/411,106

(22) Filed: Apr. 11, 2003

(65) Prior Publication Data

US 2004/0201099 A1 Oct. 14, 2004

(51) Int. Cl.[7] .......................................... H03K 19/195
(52) U.S. Cl. ............................... 326/3; 326/4; 327/367
(58) Field of Search .................. 326/1–5; 327/366–367, 327/527–528

(56) References Cited

U.S. PATENT DOCUMENTS

| | | | | |
|---|---|---|---|---|
| 4,983,971 A | * | 1/1991 | Przybysz et al. | ............ 341/133 |
| 6,483,339 B1 | * | 11/2002 | Durand et al. | ................. 326/5 |
| 6,486,756 B2 | * | 11/2002 | Tarutani et al. | ........... 333/99 S |
| 6,580,310 B2 | | 6/2003 | Herr | |

OTHER PUBLICATIONS

K.K. Likharev and V. K. Semenov, RSFQ Logic/Memory Family: A New Josephson–Junction Technology for Sub-Terahertz–Clock–Frequency Digital Systems, *IEEE Transactions on Applied Superconductivity*, vol. 1, No. 1, Mar. 1991, pp. 3–28.

* cited by examiner

*Primary Examiner*—James H. Cho
(74) *Attorney, Agent, or Firm*—Posz Law Group, PLC

(57) ABSTRACT

A single flux quantum (SFQ) pulse is generated (502) by injecting a superconductor output signal as a first signal at a "start" input (108) coupled to a superconductor delay element (104). The SFQ pulse is reflected (504) back and forth between first and second superconductor reflectors (102, 106) coupled to opposite ends of the superconductor delay element, thereby generating a time-disperse plurality of SFQ pulses at an output (110) coupled to the superconductor delay element. Thereafter, a second signal is input at a "stop" input (112) coupled to one of the first and second superconductor reflectors, thereby interrupting (506) the reflecting of the SFQ pulse at the one of the first and second superconductor reflectors, thus ending the generating of the time-disperse plurality of SFQ pulses at the output.

18 Claims, 4 Drawing Sheets

100

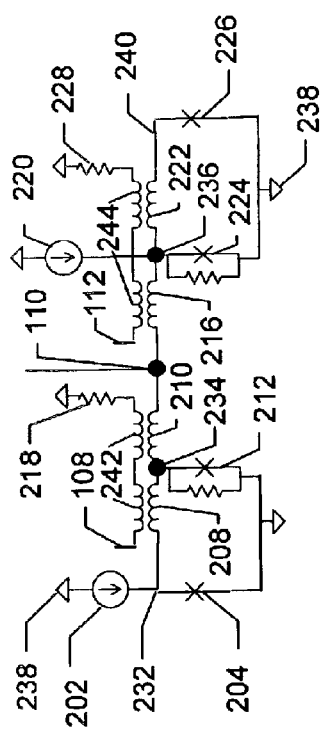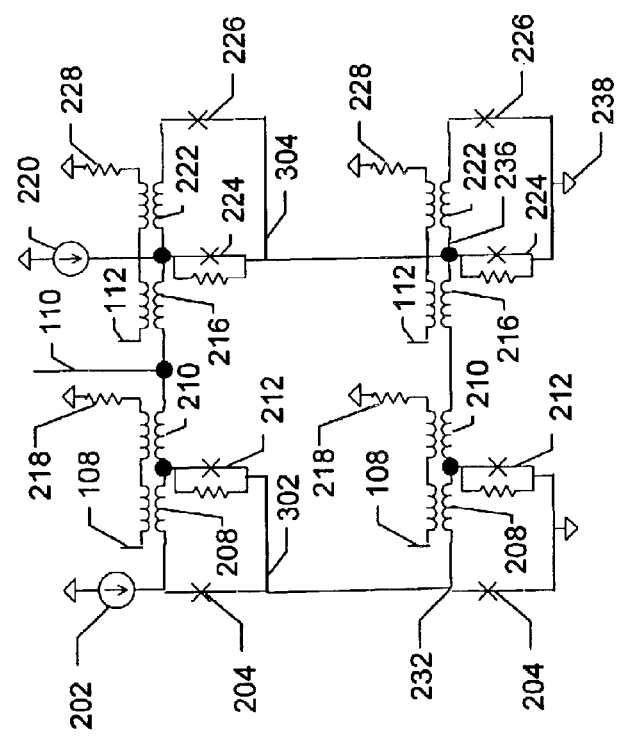
FIG. 2
200
FIG. 3
300

400

500

SUPERCONDUCTOR OUTPUT AMPLIFIER

RELATED APPLICATIONS

This application is related to co-pending application Ser. No. 10/410,923, filed concurrently herewith and entitled "Superconductor Ballistic RAM," the contents of which are incorporated herein by reference.

FIELD OF THE INVENTION

This invention relates in general to digital superconductor circuits, and more specifically to a method and apparatus for amplifying a superconductor output signal.

BACKGROUND OF THE INVENTION

Digital superconductor circuits, operating at cryogenic temperatures and at low voltage levels, need to communicate to the outside world at high speed on the order of, for example, 20 GHz. However, conventional high-speed superconductor amplifiers used in such circuits typically produce extremely low output voltages on the order of, for example, about 0.2 mV. Such low voltages are difficult to detect and are likely to be associated with a noise-induced high error rate. As a result, such conventional high-speed superconductor amplifiers may cause a slowdown, or even total corruption, of amplified signals.

Therefore, what is needed is a method and apparatus for amplifying a superconductor output signal to produce a resulting signal with a comparatively high output voltage and to thereby reduce an associated error rate.

BRIEF SUMMARY OF THE INVENTION

An object of the present invention is to provide a method for amplifying a superconductor output signal. The method includes generating a single flux quantum (SFQ) pulse by inputting a first signal at a "start" input coupled to a superconductor delay element of the amplifier. The method further includes reflecting the SFQ pulse back and forth between first and second superconductor reflectors coupled to opposite ends of the superconductor delay element, thereby generating a time-disperse plurality of SFQ pulses at an output coupled to the superconductor delay element. The method also thereafter includes inputting a second signal at a "stop" input coupled to one of the first and second superconductor reflectors, thereby interrupting the reflecting of the SFQ pulse at the one of the first and second superconductor reflectors, thus ending the generating of the time-disperse plurality of SFQ pulses at the output.

Another object of the present invention is to provide an apparatus for amplifying a superconductor output. The apparatus includes a superconductor delay element and a "start" input coupled to the superconductor delay element for generating a single flux quantum (SFQ) pulse in response to a first signal injected at the "start" input. The apparatus further includes an output coupled to the superconductor delay element, and first and second superconductor reflectors coupled to opposite ends of the superconductor delay element for reflecting the SFQ pulse back and forth between the first and second superconductor reflectors, thereby generating a time-disperse plurality of SFQ pulses at the output. In addition, the apparatus includes a "stop" input coupled to one of the first and second superconductor reflectors for interrupting a reflection of the SFQ pulse at the one of the first and second superconductor reflectors in response to a second signal at the "stop" input, thereby ending the time-disperse plurality of SFQ pulses at the output.

A third object of the present invention is to provide an integrated circuit for amplifying a superconductor output. The integrated circuit includes a superconductor delay element and a "start" input coupled to the superconductor delay element for generating a single flux quantum (SFQ) pulse in response to a first signal injected at the "start" input. The integrated circuit further includes an output coupled to the superconductor delay element, and first and second superconductor reflectors coupled to opposite ends of the superconductor delay element for reflecting the SFQ pulse back and forth between the first and second superconductor reflectors, thereby generating a time-disperse plurality of SFQ pulses at the output. In addition, the integrated circuit includes a "stop" input coupled to one of the first and second superconductor reflectors for interrupting a reflection of the SFQ pulse at one of the first and second superconductor reflectors in response to a second signal at the "stop" input, thereby ending the time-disperse plurality of SFQ pulses at the output.

Additional objects, advantages, and features of the present invention will become apparent from the following description and appended claims, taken in conjunction with the accompanying drawings.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

FIG. 2 is an electrical schematic diagram of a first embodiment of the superconductor output amplifier.

FIG. 3 is an electrical schematic diagram of a stacked arrangement of the first embodiment of the superconductor output amplifier.

DETAILED DESCRIPTION OF THE PREFERRED EMBODIMENTS

In overview form the present disclosure concerns digital superconductor systems. More particularly, various inventive concepts and principles embodied as a method and apparatus for amplifying a superconductor output signal will be discussed and disclosed. The digital superconductor systems and devices of particular interest are those being deployed and developed for operation at high speeds of twenty gigahertz and above, although the concepts and principles have application in other systems and devices.

The present disclosure is provided to further explain in an enabling fashion the best modes of making and using various embodiments in accordance with the present invention. The disclosure is further offered to enhance an understanding and appreciation for the inventive principles and advantages thereof, rather than to limit the invention in any manner. The invention is defined solely by the appended claims including any amendments made during the pendency of this application and all equivalents of those claims as issued.

It is further understood that the use of relational terms, if any, such as first and second, top and bottom, and the like are used solely to distinguish one from another entity or action without necessarily requiring or implying any actual such relationship or order between such entities or actions. Much of the inventive functionality and many of the inventive principles are best implemented with integrated circuits (ICs) such as custom or application-specific ICs. It is expected that one of ordinary skill, notwithstanding possibly significant effort and many design choices motivated by, for example, available time, current technology, and economic considerations, when guided by the concepts and principles disclosed herein will be readily capable of generating such ICs with minimal experimentation. Therefore, in the interest of brevity and minimization of any risk of obscuring the principles and concepts according to the present invention, further discussion of such ICs, if any, will be limited to the essentials with respect to the principles and concepts employed by the preferred embodiments.

Figure 1:
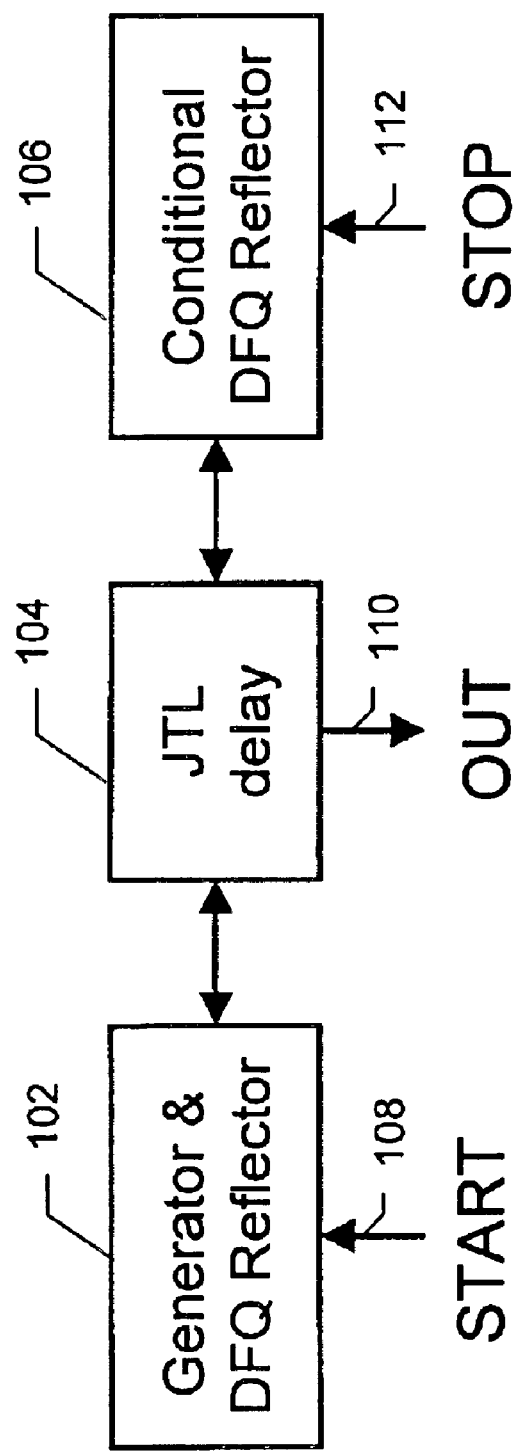
FIG. 1 is a simplified electrical block diagram of a superconductor output amplifier.

Referring to FIG. 1, a simplified electrical block diagram depicts a superconductor output amplifier 100. The amplifier 100 comprises a generator and first double flux quantum (DFQ) reflector 102 having a "start" input 108. The amplifier 100 further comprises a Josephson-junction transmission line (JTL) superconductor delay element (JTL delay element) 104 coupled to the generator and first DFQ reflector 102 at one end of the JTL delay element 104. The JTL delay element 104 is conventional and well-known. The amplifier 100 further comprises a second DFQ reflector, also referenced as a conditional DFQ reflector, 106 coupled to an opposite end of the JTL delay element 104. The JTL delay element 104 includes an output node 110 for generating an output signal. The second DFQ reflector 106 includes a "stop" input 112 arranged to interrupt the operation of the second DFQ reflector 106 when a signal is applied to the "stop" input 112.

In operation, a first signal, preferably a low-level output signal from a superconductor logic circuit (not shown), is injected at the "start" input 108. In response, the generator and DFQ reflector 102 produces a single flux quantum (SFQ) pulse. The SFQ pulse travels through the delay element 104 and is reflected by the second DFQ reflector 106. The SFQ pulse then travels back through the JTL delay element 104 and is reflected by the first DFQ reflector 102. The SFQ pulse continues to be reflected back and forth between the first and second DFQ reflectors 102, 106, thereby generating a time-disperse plurality of SFQ pulses at the output node 110. The process continues until a second signal is input at the "stop" input 112 that interrupts the reflecting of the SFQ pulse by the second DFQ reflector 106, thus ending the generation of the time-disperse plurality of SFQ pulses at the output node 110. It will be appreciated that the "stop" signal can be a low-level signal generated by the aforementioned superconductor logic circuit as well.

By operating in the manner described above, the superconductor output amplifier 100 advantageously can convert a single, low-level output pulse from a superconductor logic circuit into a plurality of time-disperse amplified pulses. Simulations have demonstrated that the amplifier 100 advantageously can produce twice the output voltage of known prior-art SFQ-to-DC converters or, more specifically, an output voltage of about 0.5 mV, with good operating margins, as the junction phase steps of the circuit are twice as high (4 pi versus 2 pi) when compared to the known prior-art SFQ-to-DC converters. External circuitry can then detect the plurality of amplified output pulses with much greater reliability than would have been possible for the single, low-level output pulse. Several embodiments of the amplifier 100 are described further herein below.

Referring to FIG. 2, an electrical schematic diagram depicts a first embodiment 200 of the superconductor output amplifier 100. The first embodiment 200 comprises a first conventional current source 202 coupled between a common node 238 and a first internal node 232. A first under-damped Josephson junction 204 is coupled between the first internal node 232 and the common node 238. Note that the Josephson junction 204 is under-damped by virtue of the absence of any bridging resistor in parallel with the junction itself.

A first inductor 208 is coupled between the first internal node 232 and a second internal node 234. A first critically-damped (i.e., with bridging resistor) Josephson junction 212 is coupled between the second internal node 234 and the common node 238. A second inductor 210 is coupled between the second internal node 234 and the output node 110. The "start" input 108 is inductively coupled through inductors 242, magnetically coupled to the first and second inductors 208, 210, and coupled in series with a resistor 218 to the common node 238. The bridging resistor may be explicit, may be inherent in the Josephson junction, or may exist as the input impedance of the load connected to the output of the amplifier. Therefore, it is quite possible to operate the circuit with no explicit bridging resistors.

A third inductor 216 is coupled between the output node 110 and a third internal node 236. A second critically-damped Josephson junction 224 is coupled between the third internal node 236 and the common node 238. A second conventional current source 220 is coupled between the common node 238 and the third internal node 236. A fourth inductor 222 is coupled between the third internal node 236 and a fourth internal node 240. A second under-damped Josephson junction 226 is coupled between the fourth internal node 240 and the common node 238. The "stop" input 112 is inductively coupled through inductors 244, magnetically coupled to the third and fourth inductors 216, 222, and coupled in series with a resistor 228 to the common node 238. The resistor 228 preferably is sized such that the relaxation time L/R allows the "stop" signal current to persist in the inductors 244 long enough to span the oscillation period of the reflected SFQ pulses.

In operation, the first, second, third, and fourth inductors 208, 210, 216, 222 and the first and second critically-damped Josephson junctions 212, 224 form the well-known JTL superconductor delay element 104. The first and second under-damped Josephson junctions 204, 226 form the DFQ reflectors 102, 106. The under-damped Josephson junctions 204, 226 are preferably similar to the critically damped Josephson junctions 212, 224, the essential difference being the absence of a bridging resistor in the under-damped Josephson junctions 204, 226. As discussed above, it is possible to operate the circuit with no explicit bridging resistors. Each of the under-damped Josephson junctions is arranged and biased such that when the junction encounters the SFQ pulse, the junction produces two SFQ pulses, exhibiting a four-pi phase rotation. The first pulsation absorbs the SFQ pulse, while the second pulsation creates the reflection of the SFQ pulse.

The preferred fabrication of the first embodiment 200 (as well as the other embodiments herein disclosed) is as a custom integrated circuit, using conventional IC fabrication methods, but with superconductor metal layers. All of the components preferably are thin-film, including the Josephson junctions. The wiring is inherently inductive and is used to form the inductors.

The material utilized for the superconductor metal preferably is niobium (Nb). A suitable alternative is niobium nitride (NbN). These are "low-temperature" superconductors, with operating temperatures of 4–10 degrees Kelvin. The insulator preferably is silicon dioxide (SiO2). Suitable alternatives are niobium pentoxide (Nb2O5) and magnesium oxide (MgO). The resistor material preferably is a non-superconducting material, such as a nitride of niobium (NbxNy), molybdenum (Mo), or a nitride of molybdenum (MoxNy). It will be appreciated that other suitable materials can be substituted as well.

The parameter values for the circuit are typical for the Josephson Transmission Line (JTL), which is well known in the art. The essential difference in accordance with the present invention is that the reflector junctions are unbridged so that they will be under-damped, as has been discussed herein above.

Referring to FIG. 3, an electrical schematic diagram depicts a stacked arrangement 300 of the first embodiment 200 of the superconductor output amplifier 100. In the stacked arrangement 300, the first embodiment 200 is coupled to a modified copy of the first embodiment 200, the modified copy lacking the current sources 202, 220. The first internal node 232 of the modified copy is coupled to the lower left common-node path 302 of the first embodiment 200, and the third internal node 236 of the modified copy is coupled to the lower right common-node path 304 of the first embodiment. In operation, a first signal to be detected is simultaneously applied at both "start" inputs 108 to start the reflection of SFQ pulses. To stop the reflection of SFQ pulses, a second signal is simultaneously applied at both "stop" inputs 112. While the plurality of SFQ pulses are being generated in both amplifiers, they will add together, advantageously producing a voltage-doubled output signal at the output node 110 with respect to the common node 238.

Figure 4:
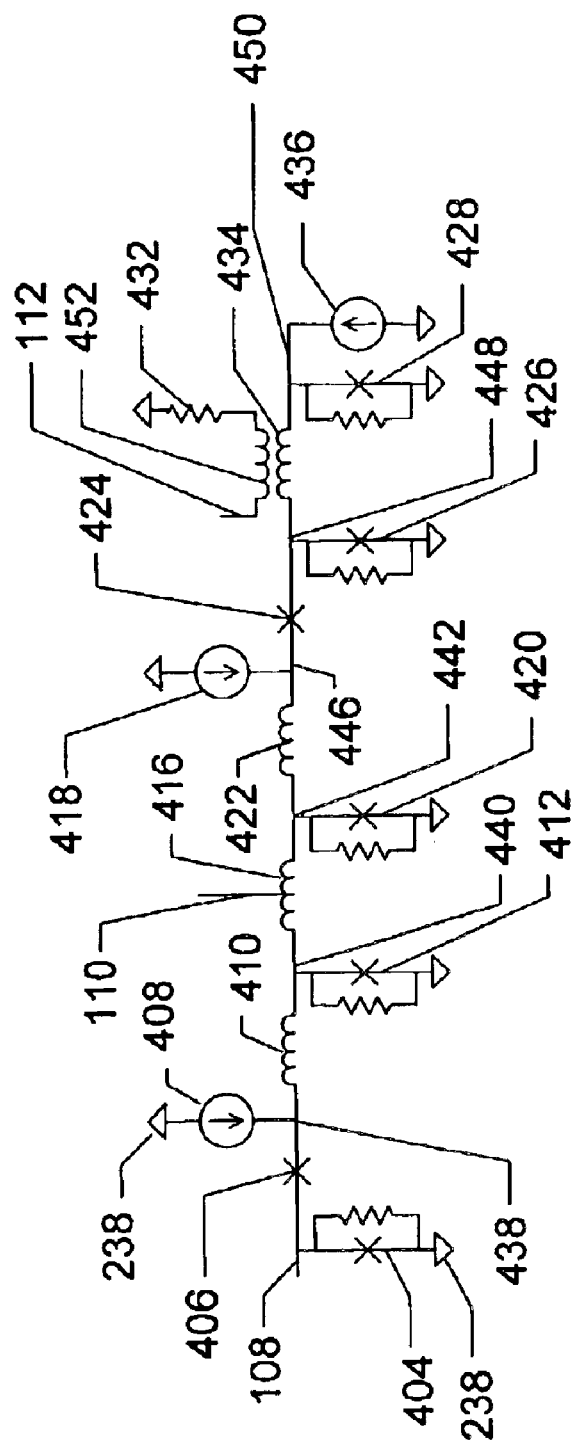
FIG. 4 is an electrical schematic diagram of a second embodiment of the superconductor output amplifier.

Referring to FIG. 4, an electrical schematic diagram depicts a second embodiment 400 of the superconductor output amplifier 100. The second embodiment comprises the "start" input 108 directly coupled to a first critically damped Josephson junction 404 whose opposite end is coupled to the common node 238. The second embodiment 400 further comprises a first under-damped Josephson junction 406 coupled between the "start" input 108 and a first internal node 438. The embodiment 400 also includes a first conventional current source 408 coupled between the common node 238 and the first internal node 438. In addition, the embodiment 400 includes a first inductor 410 coupled between the first internal node 438 and a second internal node 440. The embodiment 400 further comprises a second critically damped Josephson junction 412 coupled between the second internal node 440 and the common node 238.

The embodiment 400 further comprises a second inductor 416 coupled between the second internal node 440 and a third internal node 442. A center tap of the second inductor 416 forms the output node 110 of the amplifier. In addition, the embodiment 400 includes a third critically damped Josephson junction 420 coupled between the third internal node 442 and the common node 238. The embodiment 400 also includes a third inductor 422 coupled between the third internal node 442 and a fourth internal node 446. The embodiment further comprises a second conventional current source coupled between the common node 238 and the fourth internal node 446. In addition, the embodiment 400 includes a second under-damped Josephson junction 424 coupled between the fourth internal node 446 and a fifth internal node 448.

The embodiment 400 further comprises a fourth critically damped Josephson junction 426 coupled between the fifth internal node 448 and the common node 238. The embodiment 400 also includes a fourth inductor 434 coupled between the fifth internal node 448 and a sixth internal node 450. The embodiment 400 also includes a fifth critically damped Josephson junction 428 coupled between the sixth internal node 450 and the common node 238. In addition, the embodiment 400 includes a third conventional current source 436 coupled between the common node 238 and the sixth internal node 450. The embodiment 400 further comprises a fifth inductor 452 coupled at a first end through a resistor 432 to the common node 238. The opposite end of the fifth inductor is the "stop" input 112. The fifth inductor 452 is magnetically coupled to the fourth inductor 434.

Figure 5:
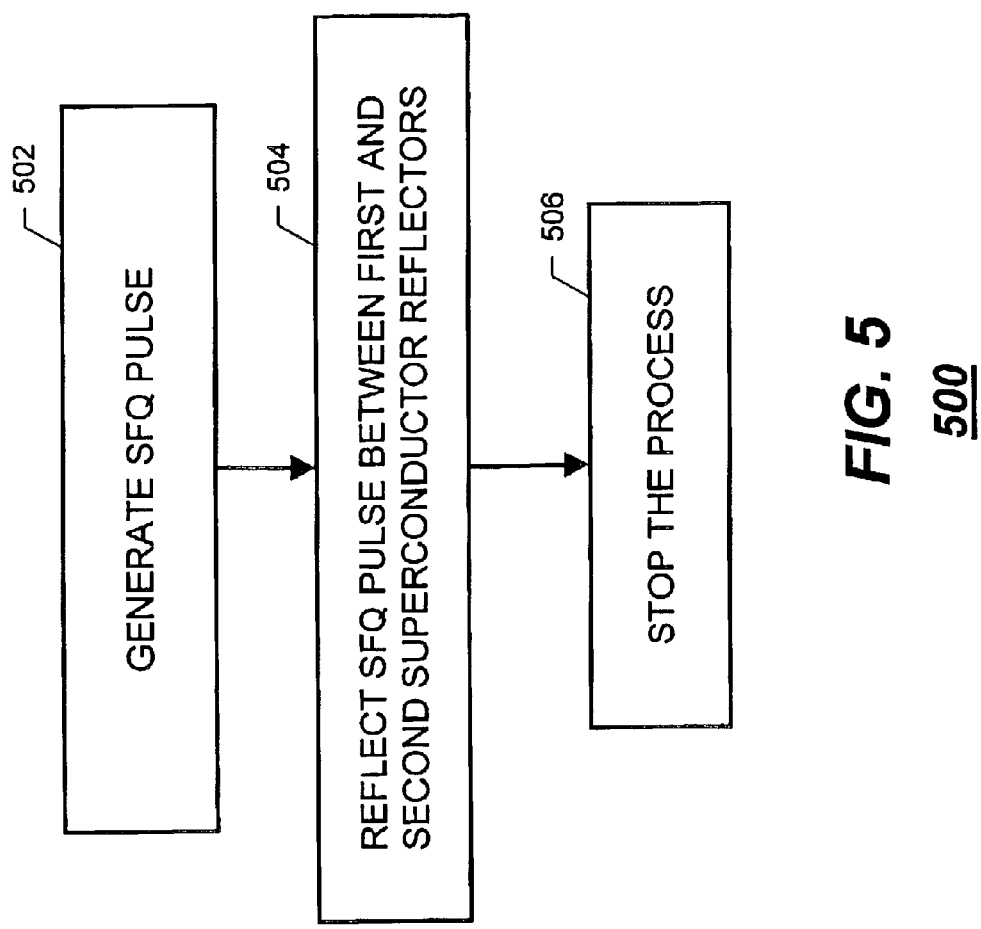
FIG. 5 is a flow diagram depicting operation of the superconductor output amplifier.

FIG. 5 depicts operation of a flow diagram 500 of the superconductor output amplifier 100. At 502, an SFQ pulse is generated. The SFQ pulse is then reflected at 504 between first and second superconductor reflectors (under-damped Josephson junctions). At a predetermined later time, the reflection process is stopped at 506 by briefly interrupting operation of one of the superconductor reflectors as discussed above.

Thus, it should be clear from the preceding discussion that the present invention provides a method and apparatus for amplifying a superconductor output signal. The method and apparatus advantageously produce a significantly higher output voltage than prior-art amplifiers, thereby reducing the error rate. One of ordinary skill in the art will recognize the techniques disclosed herein are general and can be implemented with many degrees of freedom. For example, the "start" signal can be coupled to the apparatus either inductively, as in the first embodiment 200, or non-inductively, as in the second embodiment 400.

The method and apparatus can also be used in any superconductor circuit application, including any high-bandwidth data link between cryogenic superconductor chips and room temperature circuitry. One specific environment in which the method and apparatus can be implemented is disclosed in co-pending application Ser. No. 10/410,923, filed concurrently herewith and entitled "Superconductor Ballistic RAM."

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiments were chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A method for amplifying a superconductor output signal, comprising:
    generating a single flux quantum (SFQ) pulse by injecting the superconductor output signal as a first signal at a "start" input coupled to a superconductor delay element of the amplifier;
    reflecting the SFQ pulse back and forth between first and second superconductor reflectors coupled to opposite ends of the superconductor delay element, thereby generating a time-disperse plurality of SFQ pulses at an output coupled to the superconductor delay element;

thereafter, inputting a second signal at a "stop" input coupled to one of the first and second superconductor reflectors, thereby interrupting the reflecting of the SFQ pulse at the one of the first and second superconductor reflectors, thus ending the generating of the time-disperse plurality of SFQ pulses at the output.

2. The method of claim 1, wherein reflecting the SFQ pulse back and forth between first and second superconductor reflectors comprises:

receiving the SFQ pulse by an under-damped Josephson junction; and in response to receiving the SFQ pulse, regenerating the SFQ pulse through a four-pi phase rotation of the under-damped Josephson junction.

3. The method of claim 1, wherein generating the SFQ pulse comprises inductively coupling the first signal to the superconductor delay element.

4. The method of claim 1, wherein generating the SFQ pulse comprises directly coupling the first signal to the superconductor delay element.

5. The method of claim 1, wherein inputting the second signal comprises inductively coupling the second signal to one of the first and second superconductor reflectors.

6. The method of claim 1, wherein a relaxation time of the "stop" input is greater than an oscillation period obtained when reflecting the SFQ pulse back and forth between the first and second superconductor reflectors.

7. An apparatus for amplifying a superconductor output, comprising:

a superconductor delay element;

a "start" input coupled to a superconductor delay element for generating a single flux quantum (SFQ) pulse in response to a first signal injected at the "start" input;

an output coupled to the superconductor delay element;

first and second superconductor reflectors coupled to opposite ends of the superconductor delay element for reflecting the SFQ pulse back and forth between the first and second superconductor reflectors, thereby generating a time-disperse plurality of SFQ pulses at the output;

a "stop" input coupled to one of the first and second superconductor reflectors for interrupting a reflection of the SFQ pulse at the one of the first and second superconductor reflectors in response to a second signal at the "stop" input, thereby ending the time-disperse plurality of SFQ pulses at the output.

8. The apparatus of claim 7, wherein the first and second superconductor reflectors comprise an under-damped Josephson junction, arranged to regenerate the SFQ pulse through a four-pi phase rotation in response to receiving the SFQ pulse.

9. The apparatus of claim 7, wherein the "start" input is inductively coupled to the superconductor delay element.

10. The apparatus of claim 7, wherein the "start" input is directly coupled to the superconductor delay element.

11. The apparatus of claim 7, wherein the "stop" input is inductively coupled to one of the first and second superconductor reflectors.

12. The apparatus of claim 7, wherein the "stop" input is arranged to have a relaxation time greater than an oscillation period obtained when reflecting the SFQ pulse back and forth between the first and second superconductor reflectors.

13. An integrated circuit for amplifying a superconductor output, comprising:

a superconductor delay element;

a "start" input coupled to a superconductor delay element for generating a single flux quantum (SFQ) pulse in response to a first signal injected at the "start" input;

an output coupled to the superconductor delay element;

first and second superconductor reflectors coupled to opposite ends of the superconductor delay element for reflecting the SFQ pulse back and forth between the first and second superconductor reflectors, thereby generating a time-disperse plurality of SFQ pulses at the output;

a "stop" input coupled to one of the first and second superconductor reflectors for interrupting a reflection of the SFQ pulse at the one of the first and second superconductor reflectors in response to a second signal at the "stop" input, thereby ending the time-disperse plurality of SFQ pulses at the output.

14. The integrated circuit of claim 13, wherein the first and second superconductor reflectors comprise an under-damped Josephson junction, arranged to regenerate the SFQ pulse through a four-pi phase rotation in response to receiving the SFQ pulse.

15. The integrated circuit of claim 13, wherein the "start" input is inductively coupled to the superconductor delay element.

16. The integrated circuit of claim 13, wherein the "start" input is directly coupled to the superconductor delay element.

17. The integrated circuit of claim 13, wherein the "stop" input is inductively coupled to one of the first and second superconductor reflectors.

18. The integrated circuit of claim 13, wherein the "stop" input is arranged to have a relaxation time greater than an oscillation period obtained when reflecting the SFQ pulse back and forth between the first and second superconductor reflectors.

* * * * *